(12) United States Patent
Schaefer et al.

(10) Patent No.: US 10,763,976 B1
(45) Date of Patent: Sep. 1, 2020

(54) DIGITAL LOW FREQUENCY CORRECTION CIRCUIT AND METHOD FOR REDUCING LOW FREQUENCY DISTURBANCES WITHIN A DIGITAL SIGNAL

(71) Applicant: Rohde & Schwarz GmbH & Co. KG, Munich (DE)

(72) Inventors: Andrew Schaefer, Oberhaching (DE); Andreas Maier, Munich (DE); Detlef Schlager, Taufkirchen (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 16/351,847

(22) Filed: Mar. 13, 2019

(51) Int. Cl.
| H04B 3/466 | (2015.01) |
| H04B 17/00 | (2015.01) |
| H04B 15/00 | (2006.01) |
| H04B 1/16 | (2006.01) |
| H04L 25/03 | (2006.01) |

(52) U.S. Cl.
CPC ............ H04B 17/00 (2013.01); H04B 1/16 (2013.01); H04B 15/00 (2013.01)

(58) Field of Classification Search
CPC .......... H04B 17/00; H04B 1/16; H04B 15/00; A61B 5/7203
USPC ................ 375/224, 227, 285, 296, 256, 346
See application file for complete search history.

(56) References Cited

U.S. PATENT DOCUMENTS

| 3,949,416 | A | * | 4/1976 | Stalley | ............... | H04N 9/882 |
| | | | | | | 386/272 |
| 4,947,408 | A | * | 8/1990 | Sadr | ............... | H03D 1/2245 |
| | | | | | | 329/310 |
| 6,178,288 | B1 | * | 1/2001 | Yanagawa | ............ | G11B 15/087 |
| | | | | | | 386/246 |
| 7,072,804 | B2 | | 7/2006 | Weller | | |
| 9,014,319 | B1 | * | 4/2015 | Copeland | ............ | H04L 27/2624 |
| | | | | | | 375/350 |
| 2002/0064234 | A1 | * | 5/2002 | Kaku | ............... | H04B 1/1036 |
| | | | | | | 375/285 |
| 2004/0247110 | A1 | * | 12/2004 | Harvey | ............... | H03G 3/32 |
| | | | | | | 379/390.03 |
| 2006/0120479 | A1 | * | 6/2006 | Cai | ................ | H04L 27/2624 |
| | | | | | | 375/296 |
| 2014/0240555 | A1 | * | 8/2014 | Fainstain | ............... | H04N 5/217 |
| | | | | | | 348/241 |

* cited by examiner

*Primary Examiner* — Tesfaldet Bocure
(74) *Attorney, Agent, or Firm* — Westman, Champlin & Koehler, P.A.

(57) ABSTRACT

The invention relates to a digital low frequency correction circuit and a corresponding method for correction of low frequency disturbances within a digital signal, in particular to a reduction of distortions caused by analog circuitry, such as analog signal amplifiers. The low frequency correction circuit comprises a main signal path adapted to delay a digital input signal received by a signal input terminal and at least one correction signal path including a digital correction filter adapted to filter the received digital input signal. Furthermore, an adder of the circuit is adapted to add the digital signal delayed by the main signal path and the digital signal corrected by said correction signal path to generate a digital output signal output by a signal output terminal of the circuit.

20 Claims, 5 Drawing Sheets

DIGITAL LOW FREQUENCY CORRECTION CIRCUIT AND METHOD FOR REDUCING LOW FREQUENCY DISTURBANCES WITHIN A DIGITAL SIGNAL

TECHNICAL FIELD

The invention relates to a digital low frequency correction circuit and a corresponding method for correction of low frequency disturbances within a digital signal, in particular to a reduction of distortions caused by analog circuitry, in particular analog signal amplifiers.

TECHNICAL BACKGROUND

Measurement equipment typically comprises analog circuitry as well as digital circuitry. A test setup can comprise a measurement apparatus such as an oscilloscope receiving measurement signals provided by a probe connected to a device under test DUT. The device under test DUT may also be stimulated by a signal generation apparatus generating test signals applied to the device under test DUT. A measurement apparatus such as an oscilloscope can comprise an analog frontend including a variable gain frontend amplifier receiving analog measurement signals from a probe connected to the device under test DUT. The probe itself can comprise an active probe having a signal amplifier. Accordingly, the analog measurement signal provided by the device under test can be amplified by a preamplifier of the probe and/or by a frontend amplifier forming part of the measurement apparatus. The analog circuits, in particular the analog amplifiers can distort the low frequency, LF, signal path of the received input signal. These distortions result in undesired LF transients in the acquired signal waveform. When analyzing these distortions in the frequency domain they are at a range of e.g. 1/10 dB. Accordingly, the distortion in the frequency domain caused by the analog circuitry is relative small for most use cases. However, if the distorted signal is analyzed and/or displayed by the measurement apparatus in the time domain, the distortions are quite significant. Low frequency effects caused by the distortions can comprise signal droop. Since the optimization of the analog circuitry has physical limits, in particular due to analog component tolerances, conventional measurement apparatuses can use FIR filters in their digital backend. However, this does also reach physical limits because of the implementable length of the required FIR filters. Conventional oscilloscopes can comprise de-embedding equalizers or filters which are however not able to equalize low frequency effects like droop since these low frequency effects are too long in time to be filtered by these de-embedding equalizers. Low frequency effects are in the time domain considerably lower than the employed sampling rate of an analog to digital converter used by the respective measurement apparatus.

SUMMARY OF THE INVENTION

The invention provides according to a first aspect a digital low frequency correction circuit for correction of low frequency disturbances within a digital signal,
said low frequency correction circuit comprising
a main signal path adapted to delay a digital input signal received by a signal input terminal of said low frequency correction circuit,
at least one correction signal path including a digital correction filter adapted to filter the received digital input signal and
an adder adapted to add the digital signal delayed by the main signal path and the digital signal corrected by said correction signal path to generate a digital output signal output by a signal output terminal of said low frequency correction circuit.

In a possible embodiment of the digital low frequency correction circuit according to the first aspect of the present invention, the signal input terminal of said digital low frequency correction circuit is connected to the digital output of an analog to digital converter adapted to digitize a low frequency amplified analog signal received from an analog signal amplifier, wherein the amplified analog signal includes low frequency disturbances equalized by said digital low frequency correction circuit.

In a further possible embodiment of the digital low frequency correction circuit according to the first aspect of the present invention, the analog signal amplifier is an amplifier forming part of a measurement frontend of a measurement apparatus.

In a further possible embodiment of the digital low frequency correction circuit according to the first aspect of the present invention, the analog signal amplifier comprises a preamplifier forming part of a probe connected to a measurement frontend of a measurement apparatus.

In a further possible embodiment of the digital low frequency correction circuit according to the first aspect of the present invention, a sampling rate of the analog to digital converter is at least 100 times higher than the frequency of the low frequency disturbances.

In a further possible embodiment of the digital low frequency correction circuit according to the first aspect of the present invention, a sampling rate of the analog to digital converter is at least 200 times higher than the frequency of the low frequency disturbances.

In a further possible embodiment of the digital low frequency correction circuit according to the first aspect of the present invention, a sampling rate of the analog to digital converter is at least 400 times higher than the frequency of the low frequency disturbances.

In a still further possible embodiment of the digital low frequency correction circuit according to the first aspect of the present invention, the low frequency disturbances comprise low frequency distortions within the amplified analog output signal equalized by said digital low frequency correction circuit.

In a further possible embodiment of the digital low frequency correction circuit according to the first aspect of the present invention, the low frequency disturbances comprise signal droop.

In a still further possible embodiment of the digital low frequency correction circuit according to the first aspect of the present invention, the correction filter of the correction signal path comprises an infinite impulse response filter or more than one infinite impulse response filters connected in parallel to each other.

In a further possible embodiment of the digital low frequency correction circuit according to the first aspect of the present invention, the infinite impulse response filters comprise IIR filters of first order, second order and/or higher order.

In a still further possible embodiment of the digital low frequency correction circuit according to the first aspect of the present invention, the digital correction filter of the correction signal path comprises an FIR filter or more than one FIR filters connected in parallel to each other.

In a still further possible embodiment of the digital low frequency correction circuit according to the first aspect of the present invention, the digital correction filter of the correction signal path comprises one or more infinite impulse response, IIR, filters and one or more finite impulse response, FIR, filters connected in parallel to each other.

In a further possible embodiment of the digital low frequency correction circuit according to the first aspect of the present invention, the correction signal path comprises a decimation filter having an input connected to the signal input terminal of said low frequency correction circuit adapted to decimate the received digital input signal and having an output connected to the digital correction filter of said correction signal path.

In a further possible embodiment of the digital low frequency correction circuit according to the first aspect of the present invention, a downsampling unit is provided between the output of the decimation filter and the input of the digital correction filter.

In a further possible embodiment of the digital low frequency correction circuit according to the first aspect of the present invention, the correction signal path of said digital low frequency correction circuit comprises an interpolator having an input receiving the output signal of the digital correction filter and being adapted to interpolate the digital signal corrected by said digital correction filter and having an output connected to the adder of said digital low frequency correction circuit provided to add the interpolated digital signal output by the correction signal path to the digital signal delayed by the main signal path of said digital low frequency correction circuit.

In a further possible embodiment of the digital low frequency correction circuit according to the first aspect of the present invention, an upsampling unit is provided between the digital correction filter and the input of the interpolator.

In a further possible embodiment of the digital low frequency correction circuit according to the first aspect of the present invention, the digital signal received by the input terminal of said low frequency correction circuit is generated by a digital signal source adapted to generate the digital signal.

In a further possible embodiment of the digital low frequency correction circuit according to the first aspect of the present invention, the corrected digital signal output by the output terminal of said low frequency correction circuit is converted by a digital to analog converter into an analog signal amplified by an analog signal amplifier.

In a further possible embodiment of the digital low frequency correction circuit according to the first aspect of the present invention, filter coefficients of the digital correction filter provided in the correction signal path of said digital low frequency correction circuit are adjusted or preconfigured depending on parameters of the analog signal amplifier to provide a low frequency predistortion used to compensate a low frequency distortion caused by said analog signal amplifier.

The invention further provides according to a further aspect a measurement frontend of a measurement apparatus, said measurement frontend comprising
an analog signal amplifier adapted to amplify a captured analog measurement signal to generate an amplified analog signal,
an analog to digital converter adapted to convert the amplified analog signal to provide a corresponding digital signal and comprising
a digital low frequency correction circuit used for correction of low frequency disturbances within the digital output signal of the analog to digital converter,
said digital low frequency correction circuit comprising
a main signal path adapted to delay the digital input signal received by a signal input terminal of said low frequency correction circuit,
a correction signal path including a digital correction filter adapted to filter the received digital input signal and
an adder adapted to add the digital signal delayed by the main signal path and the digital signal corrected by the digital correction filter of said correction signal path to generate a digital output signal output by a signal output terminal of said low frequency correction circuit to a processor of said measurement apparatus.

In a possible embodiment of the measurement frontend according to the second aspect of the present invention, the measurement frontend is connected to a signal input of a measurement apparatus, in particular to a signal input of an oscilloscope or to a signal input of a spectrometer.

The invention further provides according to a further aspect a signal generation apparatus comprising a digital signal source adapted to generate a digital signal supplied to a digital low frequency correction circuit comprising
a main signal path adapted to delay a digital signal received by a signal input terminal of said low frequency correction circuit from the digital signal source,
a correction signal path including a digital correction filter adapted to filter the received digital input signal and
an adder adapted to add the digital signal delayed by the main signal path and the digital signal corrected by the digital correction filter of said correction signal path to generate a digital signal output by a signal output terminal of said low frequency correction circuit to a digital to analog converter adapted to convert the corrected digital signal output by said output terminal of said low frequency correction circuit into an analog signal amplified by an analog signal amplifier of said signal generation apparatus, wherein filter coefficients of the digital correction filter provided in the correction signal path of said digital low frequency correction circuit are adjusted or preconfigured depending on parameters of the analog signal amplifier to provide a low frequency predistortion used to compensate a low frequency distortion caused by said analog signal amplifier.

The invention further provides according to a fourth aspect a method for reducing low frequency disturbances within a digital signal comprising the steps of:
receiving the digital signal as a digital input signal,
processing the received digital signal by delaying the received digital signal with a predetermined delay and filtering in parallel the received digital signal by a digital correction filter and
adding the delayed digital signal and the filtered digital signal to provide a digital output signal with reduced low frequency disturbances.

BRIEF DESCRIPTION OF FIGURES

In the following, possible embodiments of the different aspects of the present invention are described in more detail with reference to the enclosed figures.

DETAILED DESCRIPTION OF EMBODIMENTS

Figure 1:
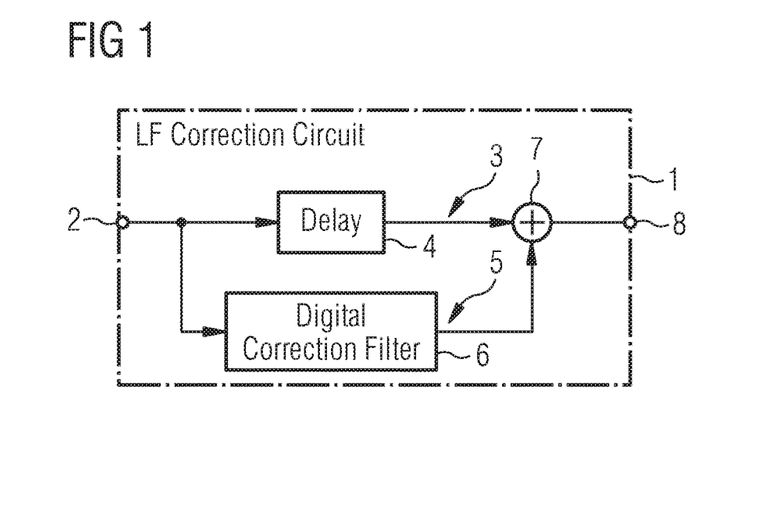
FIG. 1 shows a block diagram of a possible exemplary embodiment of a low frequency correction circuit according to a first aspect of the present invention.

As can be seen in the block diagram of FIG. 1, a low frequency, LF, correction circuit 1 (LFCCI) according to the first aspect of the present invention can be used for the correction of low frequency disturbances within a digital signal applied to a signal input terminal 2 of the digital low frequency correction circuit 1. The low frequency correction circuit 1 comprises a main signal path 3 and at least one correction signal path 5. The main signal path 3 and the correction signal path 5 are implemented in parallel within the low frequency, LF, correction circuit 1. The main signal path 3 of the low frequency, LF, correction circuit 1 is provided to delay the received digital input signal with a predetermined delay time. In a possible embodiment, the main signal path 3 comprises a delay unit 4 adapted to delay the received digital input signal with a predetermined delay time. In a further possible embodiment, the signal path 3 may comprise a long signal line having a length adapted to the required delay time. The low frequency correction circuit 1 further comprises a correction signal path 5 including at least one digital correction filter 6 adapted to filter the received digital input signal. The low frequency, LF, correction circuit 1 further comprises an adder 7 adapted to add the digital signal delayed by the main signal path 3 and the digital signal corrected by said correction signal path 5 to generate a digital output signal output by a signal output terminal 8 of the low frequency correction circuit 1 as illustrated in FIG. 1.

In a possible embodiment, the signal input terminal 2 of the digital low frequency, LF, correction circuit 1 as illustrated in FIG. 1 can be connected to a digital output of an analog to digital converter ADC adapted to digitize a low frequency amplified analog signal received by the analog to digital converter ADC from an analog signal amplifier. The amplified analog signal includes low frequency disturbances which are equalized by the digital low frequency correction circuit 1 as illustrated in FIG. 1. The analog signal amplifier causing the low frequency disturbances can form part in a possible embodiment of a measurement frontend of a measurement apparatus. Further, the analog signal amplifier causing the low frequency disturbances can also comprise a preamplifier forming part of a probe connected to a measurement frontend of a measurement apparatus. In a possible embodiment, the sampling rate of the analog to digital converter ADC providing the digital signal applied to the signal input terminal 2 of the low frequency correction circuit 1 comprises a sampling rate which is at least 100 times higher than the frequency of the respective low frequency disturbances caused by the analog circuitry. In a further possible embodiment, the sampling rate of the analog digital converter ADC generating the digital signal applied to the signal input terminal 2 of the low frequency correction circuit 1 is at least 200 times higher than the low frequency disturbances caused by the analog circuitry. In a still further possible embodiment of the digital low frequency correction circuit 1 according to the first aspect of the present invention, the sampling rate of the analog to digital converter ADC generating the digital signal applied to the signal input terminals of the low frequency correction circuit 1 is at least 400 times higher than the frequency of the low frequency disturbances caused by the analog circuitry. Low frequency disturbances comprise low frequency distortions within the amplified analog output signal which are equalized by the digital low frequency correction circuit 1 as shown in the block diagram of FIG. 1. These low frequency disturbances can for instance comprise signal droop.

The digital correction filter 6 within the correction signal path 5 of the low frequency correction circuit 1 can comprise in a possible embodiment an infinite impulse response, IIR, filter. In a further possible embodiment, the digital correction filter 6 can also comprise more than one infinite impulse response, IIR, filters connected in parallel to each other. The infinite impulse response, IIR, filters provided in the digital correction filter 6 can comprise IIR filters of first order, second order and even higher order.

In a further possible embodiment of the digital low frequency, LF, correction circuit 1, the digital correction filter 6 within the correction signal path 5 of the low frequency correction circuit 1 can comprise an FIR filter or more than one FIR filters connected in parallel to each other.

In a still further possible embodiment of the digital low frequency correction circuit 1, the digital correction filter 6 within the correction signal path 5 can also comprise one or more IIR filters and one or more FIR filters connected in parallel to each other. Provision of a FIR filter in the correction signal path 1 can fill a gap between a deembedding high frequency equalizing filter with high resolution and fast response and the IIR filters suppressing the long term low frequency disturbances in the time domain.

The correction signal path 5 of the digital low frequency correction circuit 1 can comprise a decimation filter. The decimation filter can have an input connected to the signal input terminal 2 of the low frequency correction circuit 1 and can be adapted to decimate the received digital input signal processed in the correction signal path 5. The decimation filter can comprise an output connected to the digital correction filter 6 of the correction signal path 5. In a possible exemplary embodiment, a downsampling unit can also be provided between the output of the decimation filter and the input of the digital correction filter 6.

The correction signal path 5 of the low frequency correction circuit 1 can comprise in a possible embodiment an interpolator having an input receiving the output signal of the digital correction filter 6. The interpolator can be adapted to interpolate the digital signal corrected by the digital correction filter 6 and can comprise an output connected to the adder 7 of the digital low frequency correction circuit 1. The adder 7 is provided to add the interpolated digital signal output by the correction signal path 5 to the digital signal delayed by the main signal path 3 of the digital low frequency correction circuit 1 to provide an output signal with reduced or equalized low frequency disturbances, in particular equalized signal distortions. In a further possible embodiment, an upsampling unit can also be provided between the digital correction filter 6 and the input of the subsequent interpolator within the correction signal path 5 of the low frequency correction circuit 1.

In a further possible exemplary embodiment, the digital signal received by the input terminal 2 of the low frequency correction circuit 1 can also be generated by a digital signal source. In this embodiment, the corrected digital signal output by the output terminal 8 of the low frequency correction circuit 1 can be converted by a digital to analog converter DAC into an analog signal amplified by a subsequent analog signal amplifier. In this embodiment, filter coefficients of the digital correction filter 6 provided in the correction signal path 5 of the digital low frequency correction circuit 1 are adjusted or preconfigured depending on parameters of the analog signal amplifier to provide a low frequency predistortion used to compensate a low frequency distortion caused by the respective analog signal amplifier.

Figure 6:
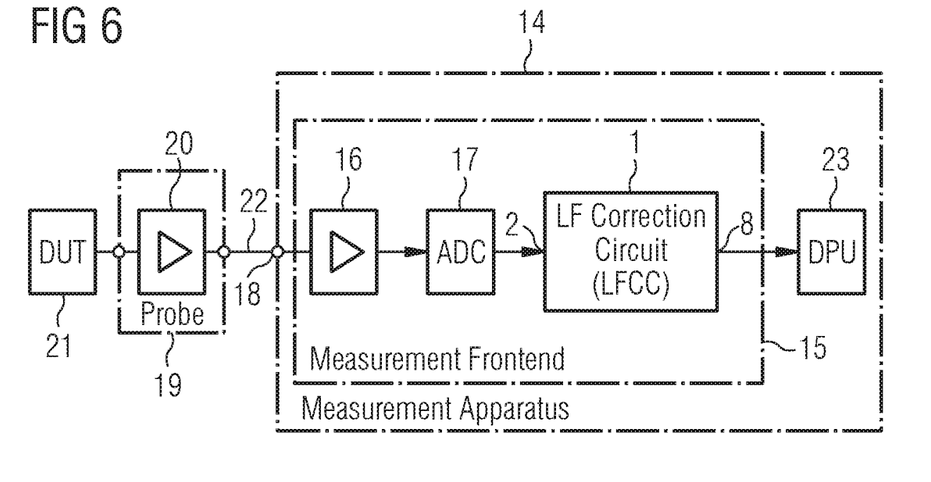
FIG. 6 shows a block diagram of a possible exemplary embodiment of a measurement apparatus according to a further aspect of the present invention.
Figure 7:
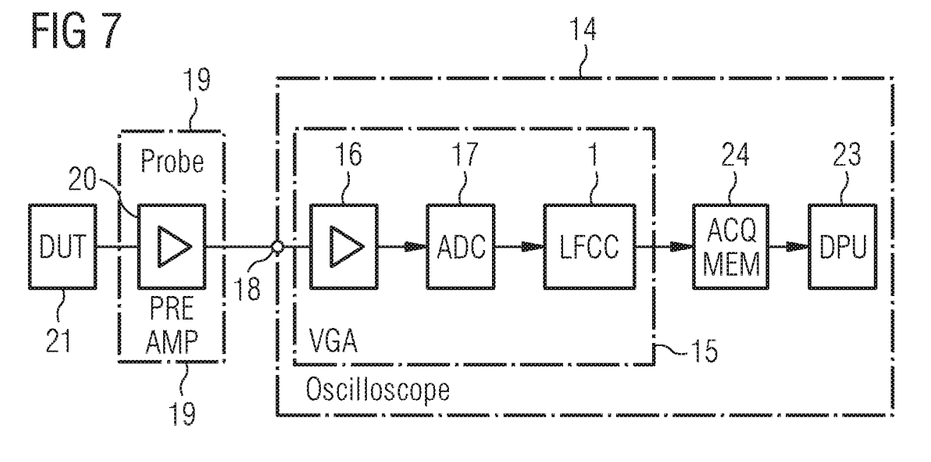
FIG. 7 shows a block diagram of a possible exemplary embodiment of the measurement apparatus illustrated in FIG. 6.
Figure 8:
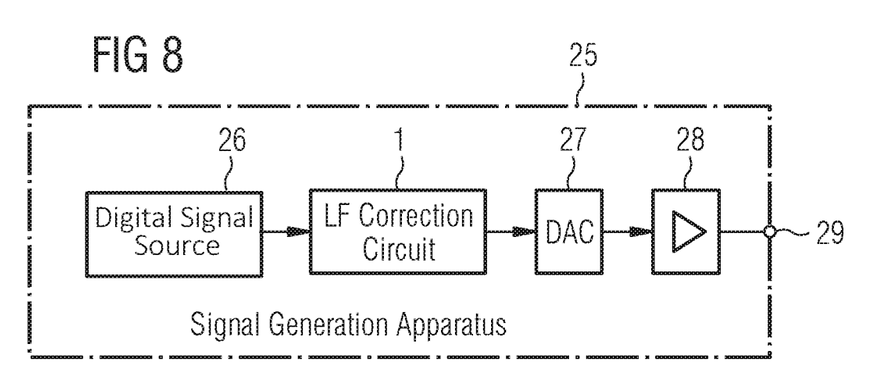
FIG. 8 shows a block diagram of a possible exemplary embodiment of the signal generation apparatus according to a further aspect of the present invention.

The low frequency correction circuit 1 as illustrated in the block diagram of FIG. 1 can be used in a possible embodiment as a component of a measurement apparatus frontend as illustrated in FIGS. 6, 7 or as a component within a signal generation apparatus as illustrated in the block diagram of FIG. 8.

Figure 2:
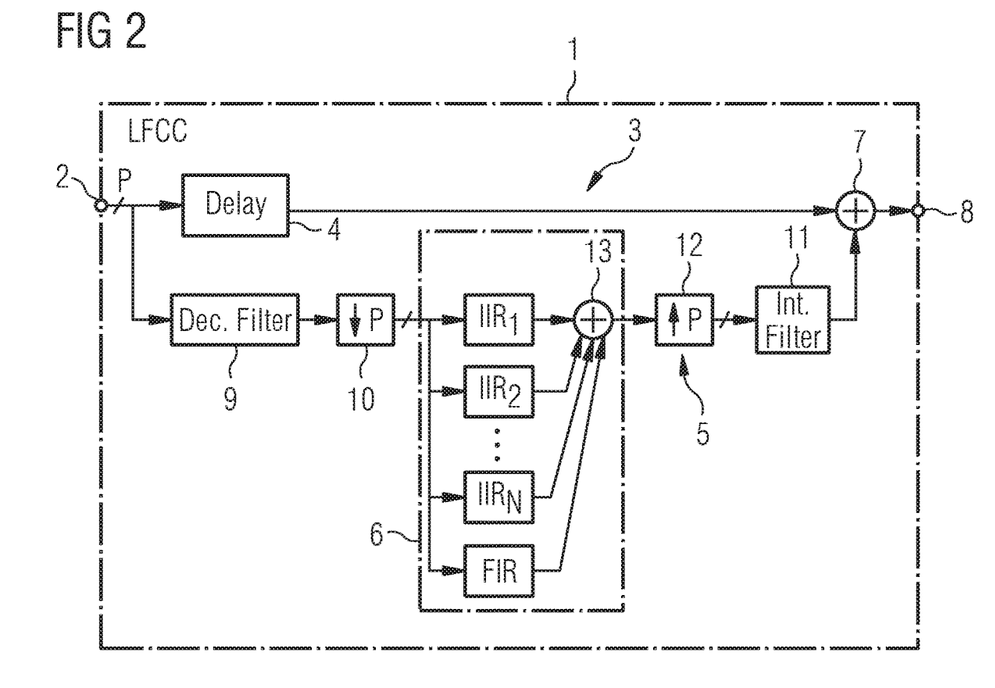
FIG. 2 shows a circuit diagram of a possible exemplary embodiment of a digital low frequency correction circuit according to the first aspect of the present invention.

FIG. 2 shows a circuit diagram of a possible exemplary embodiment of a digital low frequency correction circuit 1 according to the first aspect of the present invention. In the illustrated embodiment of FIG. 2, the correction signal path 5 comprises a digital correction filter 6 with several infinite impulse response, IIR, filters connected in parallel to each other. Further, the digital correction filter 6 can also comprise one or more FIR filters also connected in parallel to the IIR filters. In a further alternative embodiment, the digital correction filter 6 may comprise only IIR filters connected in parallel to each other. These IIR filters can comprise IIR filters of different orders, i.e. first order IIR filters, second order IIR filters and/or IIR filters of higher order. In the illustrated embodiment of FIG. 2, the correction signal path 5 further comprises a decimation filter 9 connected to the signal input terminal 2 and adapted to decimate the received digital input signal and supplying either directly via a subsequent downsampling unit 10 to the digital correction filter 6 as illustrated in FIG. 2. The correction signal path 5 of the digital low frequency correction circuit 1 further comprises in the illustrated embodiment of FIG. 2 an interpolator 11 having an input receiving the output signal of the digital correction filter 6 and being adapted to interpolate the digital signal corrected by the digital correction filter 6. The output of the interpolator filter 11 is connected to the adder 7 of the low frequency correction circuit 1 provided to add the interpolated digital signal output by the correction signal path 5 to the digital signal delayed by the main signal path 3 to provide a digital output signal output by the output terminal 8 of the low frequency correction circuit 1. In a possible embodiment, an upsampling unit 12 can be provided between the digital correction filter 6 and the interpolator filter 11 as illustrated in FIG. 2. The decimation filter 9 can comprise a moving average filter (MAVF) which can be implemented by a cascaded integrator-comb filter (CIC). The CIC filter can comprise one or more integrators and comb filter pairs. The received input signal can be fed through one or more cascaded integrators followed by a downsampler which in turn is followed by one or more comb sections. The CIC filter provides for a multirate digital signal processing and can be used for decimation. Unlike FIR filters, the CIC filter comprises a decimator or interpolator built into its architecture. The CIC filter provides an efficient implementation of a moving average filter and can be used for multirate processing. A downsampling factor of the downsampling unit 10 can correspond to the packet size P of a data packet or data group of the received digital signal as illustrated in FIG. 2. The moving average decimation filter 9 can provide an average value for each packet. Further, an upsampling factor of the upsampling unit 12 does also correspond to the packet size P. The delay caused by the delay element 4 can correspond in a possible embodiment to the delay caused by the moving average decimation filter 9, in particular a CIC filter, and the delay caused by the interpolation filter 11. In the illustrated embodiment of FIG. 2, the parallel connected IIR filters and/or FIR filters provide digital signals added by an internal adder 13 of the digital correction filter 6. The digital correction filter 6 comprises a computationally inexpensive digital circuit which is used to correct the low frequency effects caused by other circuits, in particular analog circuitry. By providing multiple parallel infinite impulse response filters, multiple or frequency effects are correctable by the digital correction filter 6. These low frequency effects can for instance also include signal droop. Further, infinite impulse response filters do not require much chip resources when implemented on an integrated circuit. More than one IIR filter is provided in parallel can deal with complex distortions caused by analog circuitry. Infinite impulse response filters of second higher order can be used to equalize oscillating distortions within the received signal.

Figure 3:
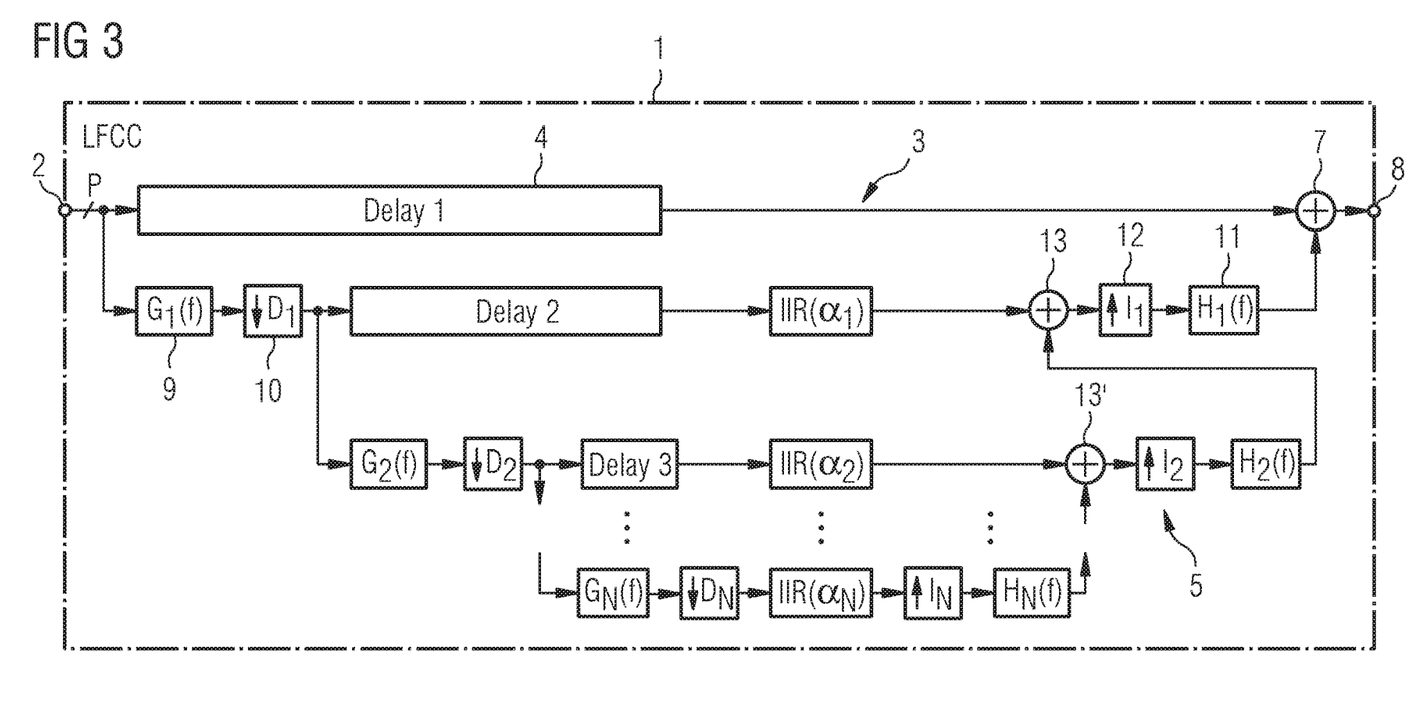
FIG. 3 shows a further circuit diagram of a possible exemplary embodiment of a digital low frequency correction circuit according to the first aspect of the present invention.

FIG. 3 shows a block diagram of a possible exemplary embodiment of a digital low frequency correction circuit 1 according to the first aspect of the present invention. In the illustrated exemplary embodiment of FIG. 3, the correction signal path 5 is implemented in a cascaded structure as shown in FIG. 3.

Figure 4:
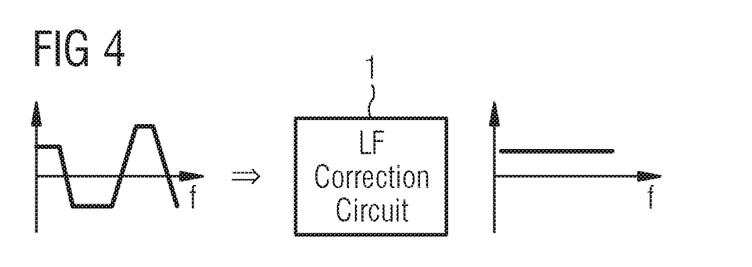
FIG. 4 shows a schematic diagram for illustrating the operation of a digital low frequency correction circuit according to the first aspect of the present invention.

FIG. 4 shows schematically the operation of a digital low frequency correction circuit 1 according to the present invention. The digital low frequency correction circuit 1 receives at its signal input terminal 2 a digital signal with a complicated distorted spectrum in the frequency domain and is adapted to equalize the spectrum at its output side as illustrated in FIG. 4.

Figure 5A:
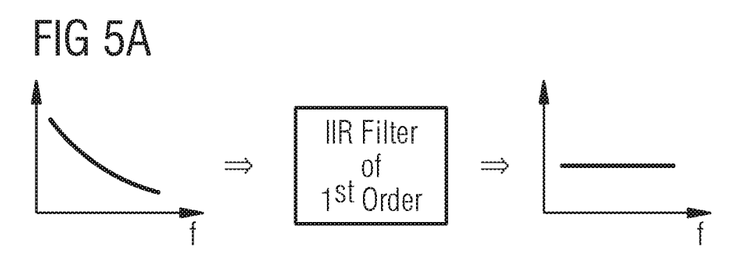
FIGS. 5A, 5B show schematically the impact of using infinite impulse response filters of different orders on the performance of the digital low frequency correction circuit according to the first aspect of the present invention.
Figure 5B:
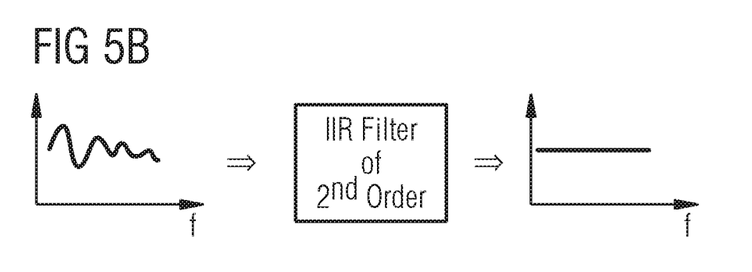

FIGS. 5A, 5B illustrate the impact of using infinite impulse response, IIR, filters of different orders in the digital correction filter 6 of the correction signal path 5 within the low frequency correction circuit 1. As can be seen from FIGS. 5A, 5B, the use of an infinite impulse response filter of higher order allows to equalize distortions of higher order, in particular oscillations as illustrated in FIG. 5B.

FIG. 6 shows a block diagram of a possible exemplary embodiment of a measurement apparatus according to a further aspect of the present invention. The measurement apparatus 14 comprises in the illustrated embodiment a measurement frontend 15. The measurement frontend 15 comprises an analog signal amplifier 16, an analog to digital converter 17 and a low frequency correction circuit 1 according to the first aspect of the present invention. The analog signal amplifier 16 is adapted to amplify a captured analog measurement signal to generate an amplified analog signal. The analog to digital converter 17 is connected to the output of the analog signal amplifier 16 as illustrated in FIG. 6. The analog to digital converter 17 is adapted to convert the amplified analog signal output by the amplifier 16 to provide a corresponding digital signal. The digital signal is supplied to the signal input terminal 2 of the low frequency correction circuit 1 as shown in FIG. 6. In the illustrated embodiment of FIG. 6, the measurement apparatus 14 comprises a signal input 18 to receive an analog measurement signal from a probe 19 having an integrated signal amplifier 20. The probe 19 is attached to a device under test 21 wherein the preamplifier 20 of the probe 19 amplifies the measurement signal applied to the signal input 18 of the measurement apparatus 1 via a signal line 22 as illustrated in FIG. 6. The amplifier 16 of the measurement frontend 15 can comprise a variable gain amplifier (VGA) providing further signal amplification of the received signal before performing an analog to digital conversion by means of the analog to digital converter 17. The analog to digital converter 17 is adapted to digitize the low frequency distorted amplified input signal into a digital signal supplied to the low frequency correction circuit 1. The low frequency correction circuit 1 forms a low frequency equalizer filter adapted to equalize the low frequency distortions within the digitized signal received from the analog to digital converter 17. The sampling rate R of the analog to digital converter 17 is considerably higher than the low frequency distortions or disturbances within the received signal. In a possible embodiment, the low frequency of the disturbances is 100 times lower than the sampling rate R of the analog to digital converter 17, preferably 200 times lower, and even more preferably 400 times lower. The subsequent low frequency correction circuit 1 comprises a structure as illustrated in the block diagram of FIG. 1 having a main signal path 3 and a parallel correction signal path 5. The output terminal 8 of the low frequency correction circuit 1 is connected to a data processing unit 23 of the measurement apparatus 14.

Figure 10:
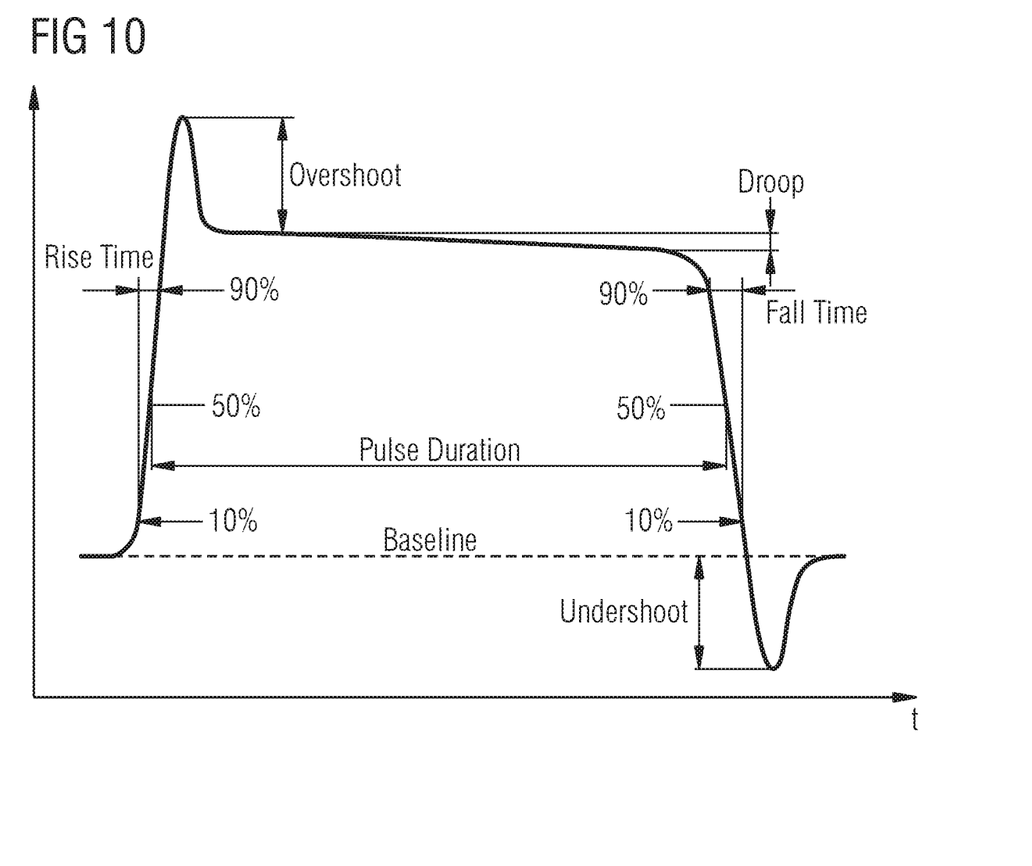
FIG. 10 shows a signal diagram for illustrating exemplary disturbances within a received digital signal.

FIG. 7 shows a possible embodiment of the measurement apparatus 14 comprising a low frequency correction circuit 1 according to the first aspect of the present invention. In the illustrated embodiment of FIG. 7, the measurement apparatus 14 comprises a measurement frontend 15 including the low frequency correction circuit 1 connected to an acquisition memory 24 used for memorizing temporarily the digital output signal of the low frequency correction circuit 1 for further processing by the digital processing unit 23 of the oscilloscope 14. The low frequency correction circuit 1 provides corrections to minimize the low frequency disturbances of the signal before triggering is performed within the oscilloscope 14. Corrections performed by means of algorithms executed within the digital processing unit 23 are less as effective since they are based on erroneously triggered and erroneously recorded digital signals stored in the acquisition memory 24 of the oscilloscope 14. The low frequency correction circuit 1 increases the performance of the oscilloscope 14 and reduces low frequency effects caused by amplifiers provided within the probe 19 and/or the analog frontend. The oscilloscope 14 illustrated in FIG. 7 performs as two basic functions signal acquisition and signal analysis. During acquisition, the sampled signals are saved to the acquisition memory 24 and during analysis, the acquired waveforms are analyzed by the digital processing unit 23 and can be output to a display of the oscilloscope 14. The oscilloscope 14 can comprise a digital sampling oscilloscope or a real-time sampling oscilloscope. The oscilloscope 14 comprises a vertical system, a horizontal system as well as a trigger system. The trigger of the oscilloscope 14 can ensure a stable display of waveforms for continuous monitoring of repetitive signals displayed on a display unit of the oscilloscope 14. In contrast to an analog trigger, a digital trigger system can operate directly on the samples provided by the analog to digital converter 17 stored in the acquisition memory 24 of the oscilloscope 14. The probe 19 can comprise a voltage probe and/or an AC/DC current probe. The probe 19 illustrated in FIG. 7 is an active probe using active components such as field effect transistors that provide low input capacitance. This makes it possible to measure circuits in which the impedance is not known and allow longer ground leads to be used. The sampling rate R of the oscilloscope 14 comprises a number of samples it can acquire within one second which can be at least 2.5 times greater than the oscilloscope bandwidth. The digital oscilloscope 14 can comprise high sample rates and bandwidth in excess of 6 GHz being designed to accommodate high speed single shot transient events. The oscilloscope 14 can achieve this by oversampling at rates that can be greater than five times the bandwidth. With increasing sampling rate R and the size of the acquisition memory 24 required to store the captured signals does also increase. with increasing size of the acquisition memory 24 more waveforms can be captured at a given sample rate. By performing signal acquisition, the oscilloscope 14 continuously does save, process and display data. The oscilloscope 14 as illustrated in FIG. 7 comprises an excellent overall step response. In particular, the low frequency correction circuit 1 provides for a suppression of signal droop in a pulse waveform as illustrated in FIG. 10. Signal droop can be defined as a quotient between a dropping voltage and the amplitude of the input voltage of a signal pulse. For example, a signal droop can be defined as Vdrop divided by Vin. The V drop voltage may include the overshoot voltage as illustrated in FIG. 10. With the low frequency correction circuit 1, it is possible to reduce the relative signal droop parameter under 1%. The droop effect is very low frequent in comparison to the measured signal, i.e. has a frequency which is 100 times lower than the sampling rate R of the analog to digital converter 17. The droop effect occurs normally in a frequency range of e.g. 100 to 800 MHz. With the low frequency correction circuit 1 according to the present invention, it is possible to suppress the undesired low frequency droop effect effectively.

FIG. 8 shows a block diagram of a possible exemplary embodiment of a signal generation apparatus 25 according to a further aspect of the present invention. The signal generation apparatus 25 can comprise a digital signal source 26 adapted to generate a digital signal applied to the digital low frequency correction circuit 1 according to the first aspect of the present invention. The corrected digital signal output by the low frequency correction circuit 1 is supplied to a digital to analog converter 27 of the signal generation apparatus 25. The digital to analog converter 27 is adapted to convert the corrected digital signal output by the output terminal of the low frequency correction circuit 1 into an analog signal amplified by an analog signal amplifier 28 of the signal generation apparatus 25. The amplified analog signal can be output by an output terminal 29 of the signal generation apparatus 25. In a possible embodiment, the filter coefficients of the digital correction filter 6 are adjusted or preconfigured depending on parameters of the analog signal amplifier 28 to provide a low frequency predistortion used to compensate the low frequency distortion caused by the analog signal amplifier 28. Accordingly, the low frequency correction circuit 1 provides a correction in the digital domain corresponding to a low frequency predistortion used to compensate a low frequency distortion caused by the subsequent analog signal amplifier 28. In the analog domain the signal generation apparatus 25 can comprise in a possible embodiment an arbitrary waveform signal generation apparatus. The low frequency correction circuit 1 is provided for removing of signal droop and/or low frequency interferences. The low frequency correction circuit 1 allows to generate signals with a predefined low frequency performance and strongly reduced low frequency disturbances, in particular low frequency distortions.

Figure 9:
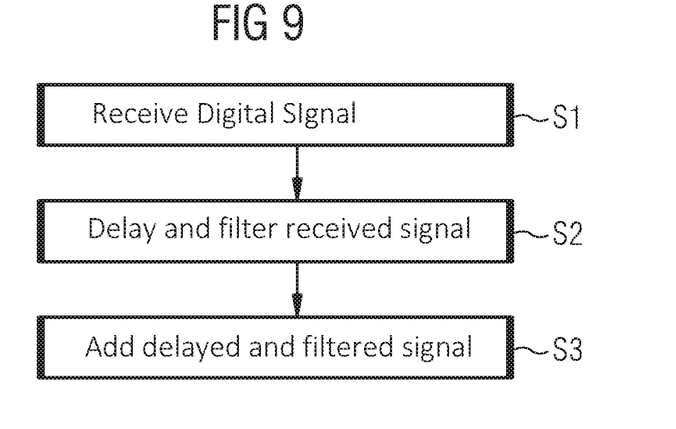
FIG. 9 shows a flowchart of a possible exemplary embodiment of a method for reducing low frequency disturbances within a digital signal according to a further aspect of the present invention.

FIG. 9 shows a flowchart of a possible exemplary embodiment of a method for reducing low frequency disturbances within a digital signal according to a further aspect of the present invention. In the illustrated exemplary embodiment, the method comprises three main steps S1, S2, S3.

In a first step S1, a digital signal is received, for instance from an analog to digital converter 17 as illustrated in FIGS. 6, 7 or from a digital signal source 26 as illustrated in FIG. 8.

In a further step S2, the received digital signal is processed by delaying the received digital signal with a predetermined delay and by filtering in parallel the received digital signal by a digital correction filter such as a digital correction filter 6 as illustrated in FIG. 1.

In a further step S3, the delayed digital signal and the filtered digital signal are added to provide a digital output signal with significantly reduced low frequency disturbances, in particular reduced signal droop.

The low frequency correction circuit 1 according to the present invention can be used for a wide range of applications and use cases. The low frequency correction circuit 1 can be used for instance in a measurement frontend 15 of a measurement apparatus 14, in particular an oscilloscope as illustrated in the block diagrams of FIGS. 6, 7. Further, the low frequency correction circuit 1 according to the present invention can also be used within a signal generation apparatus 25 as illustrated in the block diagram of FIG. 8. The parameters of the filters implemented in the low frequency correction circuit 1 can in a possible embodiment be pre-configured depending on the known parameters of the analog circuitry, in particular the signal parameters of any preceding or subsequent analog amplifiers. In a possible embodiment, the filter coefficients of the filters implemented in the digital correction filter 6 of the low frequency correction circuit 1 can be adjustable during operation of the measurement apparatus 14 or the signal generation apparatus 25. This may be used for performing fine-tuning depending on the parameters of the analog circuitry. In a possible implementation, the fine-tuning of the filter parameters of the low frequency correction circuit 1 to the parameters of the analog circuitry can be performed in a feedback loop by comparing the input and/or output signals of analog amplifiers. In a preferred embodiment, the low frequency correction circuit 1 comprises several parallel connected infinite impulse response filters to equalize disturbances and/or distortions. The infinite impulse response filters form recursive digital filters and can comprise lower computational complexity than corresponding non-recursive FIR filters.

The digital correction filter 6 can be designed comparatively easy and can be implemented within an integrated circuit. Equalizing effects can be reduced by increasing the length of the moving average filter 9 without changing the decimation factor. Further, in a possible embodiment, a high frequency equalization filter can be connected in front of the input signal terminal 2 of the low frequency correction circuit 1. In a preferred embodiment, the frequency ranges of the high frequency equalization filter and the low frequency correction circuit 1 according to the present invention do overlap. The low frequency correction circuit 1 according to the present invention is implemented for a long and continuous correction of low frequency disturbances.

The invention claimed is:

1. A digital low frequency, LF, correction circuit for correction of low frequency disturbances within a digital signal,
    said low frequency, LF, correction circuit comprising
        a main signal path adapted to delay a digital input signal received by a signal input terminal of said low frequency, LF, correction circuit,
        at least one correction signal path including a digital correction filter adapted to filter the received digital input signal and
        an adder adapted to add the digital signal delayed by the main signal path and the digital signal corrected by said correction signal path to generate a digital output signal output by a signal output terminal of said low frequency, LF, correction circuit,
    wherein the signal input terminal of said digital low frequency, LF, correction circuit is connected to the digital output of an analog to digital converter, ADC, adapted to digitize a low frequency amplified analog signal received by said analog to digital converter, ADC, from an analog signal amplifier wherein the amplified analog signal includes low frequency disturbances equalized by said digital low frequency, LF, correction circuit.

2. The digital low frequency, LF, correction circuit according to claim 1 wherein the analog signal amplifier is an amplifier forming part of a measurement frontend of a measurement apparatus, or wherein the analog signal amplifier is a preamplifier forming part of a probe connected to a measurement frontend of a measurement apparatus.

3. The digital low frequency, LF, correction circuit according to claim 1 wherein a sampling rate of the analog to digital converter, ADC, is at least 100 times higher than the frequency of the low frequency disturbances, preferably 200 times higher, more preferably 400 times higher.

4. The digital low frequency, LF, correction circuit according to claim 3 wherein the low frequency disturbances comprise low frequency distortions within the amplified analog output signal equalized by said digital low frequency, LF, correction circuit.

5. The digital low frequency, LF, correction circuit according to claim 1 wherein the low frequency disturbances comprise signal droop.

6. The digital low frequency, LF, correction circuit according to claim 1 wherein the correction filter of the correction signal path comprises an infinite impulse response, IIR, filter or more than one infinite impulse response, IIR, filters connected in parallel to each other.

7. The digital low frequency, LF, correction circuit according to claim 6 wherein the infinite impulse response, IIR, filters comprise IIR filters of first order, second order and higher order.

8. The digital low frequency, LF, correction circuit according to claim 1 wherein the digital correction filter of the correction signal path comprises an FIR filter or more than one FIR filters connected in parallel to each other.

9. The digital low frequency, LF, correction circuit according to claim 1 wherein the digital correction filter of the correction signal path comprises one or more IIR filters and one or more FIR filters connected in parallel to each other.

10. The digital low frequency, LF, correction circuit according to claim 1 wherein the correction signal path comprises a decimation filter having an input connected to the signal input terminal of said low frequency, LF, correction circuit adapted to decimate the received digital input signal and having an output connected to the digital correction filter of said correction signal path.

11. The digital low frequency, LF, correction circuit according to claim 10 wherein a downsampling unit is provided between the output of the decimation filter and the input of the digital correction filter.

12. The digital low frequency, LF, correction circuit according to claim 1 wherein the correction signal path of said digital low frequency, LF, correction circuit comprises an interpolator having an input receiving the output signal of the digital correction filter and being adapted to interpolate the digital signal corrected by said digital correction filter and having an output connected to the adder of said digital low frequency, LF, correction circuit provided to add the interpolated digital signal output by the correction signal path to the digital signal delayed by the main signal path of said digital low frequency, LF, correction circuit.

13. The digital low frequency, LF, correction circuit according to claim 12 wherein an upsampling unit is provided between the digital correction filter and the input of the interpolator.

14. The digital low frequency, LF, correction circuit according to claim 1 wherein the digital signal received by the input terminal of said low frequency, LF, correction circuit is generated by a digital signal source adapted to generate the digital signal.

15. The digital low frequency, LF, correction circuit according to claim 14 wherein the corrected digital signal output by the output terminal of said low frequency, LF, correction circuit is converted by a digital to analog converter, DAC, into an analog signal amplified by an analog signal amplifier.

16. The digital low frequency, LF, correction circuit according to claim 15 wherein filter coefficients of the digital correction filter provided in the correction signal path of said digital low frequency, LF, correction circuit are adjusted depending on parameters of the analog signal amplifier to provide a low frequency, LF, predistortion used to compensate a low frequency, LF, distortion caused by said analog signal amplifier.

17. A measurement frontend of a measurement apparatus, said measurement frontend comprising
an analog signal amplifier adapted to amplify a captured analog measurement signal to generate an amplified analog signal,
an analog to digital converter, ADC, adapted to convert the amplified analog signal to provide a corresponding digital signal and comprising
a digital low frequency, LF, correction circuit used for correction of low frequency, LF, disturbances within the digital output signal of the analog to digital converter, ADC, said digital low frequency, LF, correction circuit comprising:
a main signal path adapted to delay the digital input signal received by a signal input terminal of said low frequency, LF, correction circuit,
a correction signal path including a digital correction filter adapted to filter the received digital input signal and
an adder adapted to add the digital signal delayed by the main signal path and the digital signal corrected by the digital correction filter of said correction signal path to generate a digital output signal output by a signal output of said low frequency, LF, correction circuit to a processor of said measurement apparatus.

18. The measurement frontend according to claim 17 connected to a signal input of a measurement apparatus, in particular to a signal input of an oscilloscope or to a signal input of a spectrometer.

19. A signal generation apparatus comprising a digital signal source adapted to generate a digital signal supplied to a digital low frequency, LF, correction circuit comprising
a main signal path adapted to delay a digital signal received by a signal input terminal of said low frequency, LF, correction circuit from the digital signal source,
a correction signal path including a digital correction filter adapted to filter the received digital input signal and
an adder adapted to add the digital signal delayed by the main signal path and the digital signal corrected by the digital correction filter of said correction signal path to generate a digital signal output by a signal output terminal of said low frequency, LF, correction circuit to a digital to analog converter, DAC, adapted to convert the corrected digital signal output by said output terminal of said low frequency, LF, correction circuit into an analog signal amplified by an analog signal amplifier of said signal generation apparatus, wherein filter coefficients of the digital correction filter provided in the correction signal path of said digital low frequency, LF, correction circuit are adjusted or preconfigured depending on parameters of the analog signal amplifier to provide a low frequency, LF, predistortion used to compensate low frequency, LF, distortion caused by said analog signal amplifier.

20. A method for reducing low frequency, LF, disturbances within a digital signal, comprising the steps of
receiving the digital signal as a digital input signal;
processing the received digital signal by delaying the received digital signal with a predetermined delay and filtering in parallel the received digital signal by a digital correction filter; and
adding the delayed digital signal and the filtered digital signal to provide a digital output signal with reduced low frequency, LF, disturbances,
wherein the digital signal is received as digital output of an analog to digital converter, ADC, which digitizes a low frequency amplified analog signal received by said analog to digital converter, ADC, from an analog signal amplifier, and wherein the amplified analog signal includes low frequency disturbances equalized by said method for reducing low frequency, LF, disturbances.

* * * * *